US006756322B2

(12) United States Patent
Ohta

(10) Patent No.: US 6,756,322 B2
(45) Date of Patent: Jun. 29, 2004

(54) METHOD FOR EVENLY COATING SEMICONDUCTOR LASER END FACES AND FRAME USED IN THE METHOD

(75) Inventor: Masayuki Ohta, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 105 days.

(21) Appl. No.: 09/994,673

(22) Filed: Nov. 28, 2001

(65) Prior Publication Data

US 2002/0076943 A1 Jun. 20, 2002

(30) Foreign Application Priority Data

Nov. 28, 2000 (JP) ....................................... 2000-361382

(51) Int. Cl.[7] ............................................... C23C 14/24

(52) U.S. Cl. ....................... 438/779; 438/782; 427/596; 427/255.11; 427/255.19; 427/255.21

(58) Field of Search ................................ 438/779, 782; 427/594, 255.11, 255.19, 255.21; 118/723 EB

(56) References Cited

U.S. PATENT DOCUMENTS 5,763,020 A * 6/1998 Yang .......................... 427/569
6,037,006 A * 3/2000 Chakrabarti et al. ........ 427/294

FOREIGN PATENT DOCUMENTS

JP 04162613 A * 6/1992 ......... H01L/21/203
JP 6-69607 3/1994
JP 6-125149 5/1994
JP 9-260777 10/1997
JP 10304647 A * 11/1998 .......... H02K/44/06
JP 11-284279 10/1999

OTHER PUBLICATIONS

Powell et al., Vapor Deposition, Electrochemical Society, 2nd Ed. pp 237–242 (1966).*

* cited by examiner

*Primary Examiner*—Timothy Meeks
(74) *Attorney, Agent, or Firm*—Birch, Stewart, Kolasch & Birch, LLP

(57) ABSTRACT

A method with which all semiconductor lasers can be used as products is provided by regulating reflectance variations of all the semiconductor laser end faces arranged in an electron beam deposition apparatus after completion of deposition to a predetermined range when semiconductor laser end faces are coated. An end face (3) that is placed at a position at which the film thickness is made relatively thicker than those of other coat batches due to the large flux of a deposition beam is inclined by an angle β to adjust the incident angle of the deposition beam. The relationship, actual film thickness (9*b*)=film thickness (9*b*) in direction of deposition beams central axis (8*a*)×cos β, is utilized to reduce the film thickness of the end face (3) to the predetermined range.

1 Claim, 8 Drawing Sheets

METHOD FOR EVENLY COATING SEMICONDUCTOR LASER END FACES AND FRAME USED IN THE METHOD

BACKGROUND OF THE INVENTION

The present invention relates to a method for coating an end face of a high-output semiconductor laser for use in CD-R/RW or the like by electron beam deposition wherein the film thickness is adjusted upon the end-face coating, and a fixing frame used in this method.

Conventionally, electron beam deposition has been employed as a method for coating an end face of a semiconductor laser.

However, with an increased demand for semiconductor lasers for use in communication, storage and so forth in recent years, it is becoming necessary to improve work efficiency by coating a large number of semiconductor lasers in one work when the end faces, which are cleavage faces, are coated before manufacturing as a product.

Accordingly, a method of arranging a large number of semiconductor lasers at once in an electron beam deposition apparatus is employed to improve work efficiency. For example, a method has been adopted wherein end faces of a plurality of semiconductor lasers are placed on each of coat batches arranged in a m×n matrix composed of m vertical columns and n horizontal rows.

As described above, work efficiency of end-face coating can be improved by the method of coating end faces by arranging a large number of semiconductor end faces at once.

However, a problem of this end-face coating by electron beam deposition is that, when a large number of end faces are coated at once, differences in incident angles of a deposition beam to coat batches become large, thereby resulting in thickness variations of deposited films after completion of the deposition.

Such thickness variations of the deposited films result in reflectance variations of semiconductor end faces after completion of deposition thereon as shown in the relationship between the end-face coating film thickness and reflectance when $Al_2O_3$ is used as a deposition material in FIG. 1. Such reflectance variations substantially affect characteristics of the semiconductor lasers.

For example, it is known that, in a high-output semiconductor laser, an emission lifetime becomes short when the reflectance of an end face (laser-emitting face) is high, while a so-called SCOOP (Self Coupled Optical Pickup) defect occurs when the reflectance is low. Therefore, when an end face of a semiconductor laser is coated, the reflectance of the end face after completion of deposition needs to match a predetermined reflectance (usually, about 13±2%). FIG. 2 shows reflectance variations after deposition at positions at which semiconductor end faces are disposed. In this figure, the reflectance of a semiconductor laser constituting a coat batch E in the center of the second row is out of the predetermined reflectance range. Therefore, this semiconductor laser cannot be used as a product and thus the industrial demand for a high G/W yield cannot be met.

SUMMARY OF THE INVENTION

Accordingly, the object of the present invention is to provide a method for ensuring a higher G/W yield by regulating reflectance variations of all semiconductor lasers arranged in an electron beam deposition apparatus after completion of deposition when end faces of the semiconductor lasers are coated.

In order to achieve the above object, there is provided a method for coating a semiconductor laser end face with a coating material by electron beam deposition by disposing a plurality of coat batches each constituted by semiconductor laser end faces on an array face having a central axis of a deposition beam as a normal line, wherein the coat batches are disposed at positions in the same distances from a position opposed to the center of the deposition beam on the array face.

In this constitution, since coat batches are positioned at an equal distance from a position opposed to the central axis of a deposition beam emitted from a deposition source on the array face, incident angles of this deposition beam to the respective coat batches are almost equal.

Furthermore, when the incident angles to the end faces are almost equal, the amounts of a coat material deposited through a unit area per a unit time are also almost equal, thereby preventing film thickness variations of the deposited films.

Also, there is provided a method for coating a semiconductor laser end face with a coating material by electron beam deposition by disposing a plurality of coat batches each constituted by semiconductor laser end faces on an array face having a central axis of a deposition beam as a normal line, wherein an angle-adjusting step for adjusting an incident angle $\alpha$, $\beta$ of the deposition beams to the coat batches is included so that thicknesses of films formed by the deposition beam on the coat batches should be within a predetermined range.

In this constitution, since the incident angles to the respective coat batches are adjusted so that the thicknesses of films formed by the deposition beam on the respective coat batches arranged on the array face should be within the predetermined range, the reflectance affected by the deposition film formed on each coat batch is also within the predetermined range, thereby causing no reflectance variations after formation of the deposition films due to the difference in positions in the electron beam deposition apparatus.

Also, there is provided a method for coating a semiconductor laser end face with a coating material by electron beam deposition by disposing a plurality of coat batches each constituted by semiconductor laser end faces on an array face having a central axis of a deposition beam as a normal line, wherein when an incident angle of a deposition beam to a coat batch positioned on the array face at a position opposed to the central axis of the deposition beam is assumed as a first incident angle and an incident angle of a deposition beam to a coat batch that is the largest incident angle of the deposition beam on the array face is assumed as a second incident angle, an angle-adjusting step for adjusting at least the first incident angle so that the angle difference between the first and second incident angles $\beta$, $\alpha$ should be within a predetermined range.

In this constitution, since the angle adjustment step for adjusting the first incident angle is performed so that the angle difference between the first and second incident angles should be decreased to the predetermined range, the difference in the deposition amounts due to the difference in incident angles in a unit area per a unit time is also decreased, thereby preventing film thickness variations on coat batches after completion of deposition.

Also, there is provided a fixing frame in which a plurality of bar arranging jigs for housing a plurality of laser bars so that their respective end faces should face in the same direction when the semiconductor laser end faces are coated by electron beam deposition, wherein an adjustment mechanism is provided to adjust an angle of each bar arranging jig with an array face assuming the central axis of the deposition beam in a fixing frame as a normal line.

In this constitution, since a fixing frame arranged on the array face assuming the central axis of the deposition beam as a normal line has an adjustment mechanism for adjusting an angle between this array face of the fixing frame and the array face of the bar arranging jig housing a plurality of laser bars, the incident angles of the deposition beam to the end faces of the semiconductor lasers disposed in this fixing frame are adjusted in the fixing frame.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The constitution of a first embodiment of the invention is described below with reference to FIGS. 3 to 5A and 5B.

Figure 3:
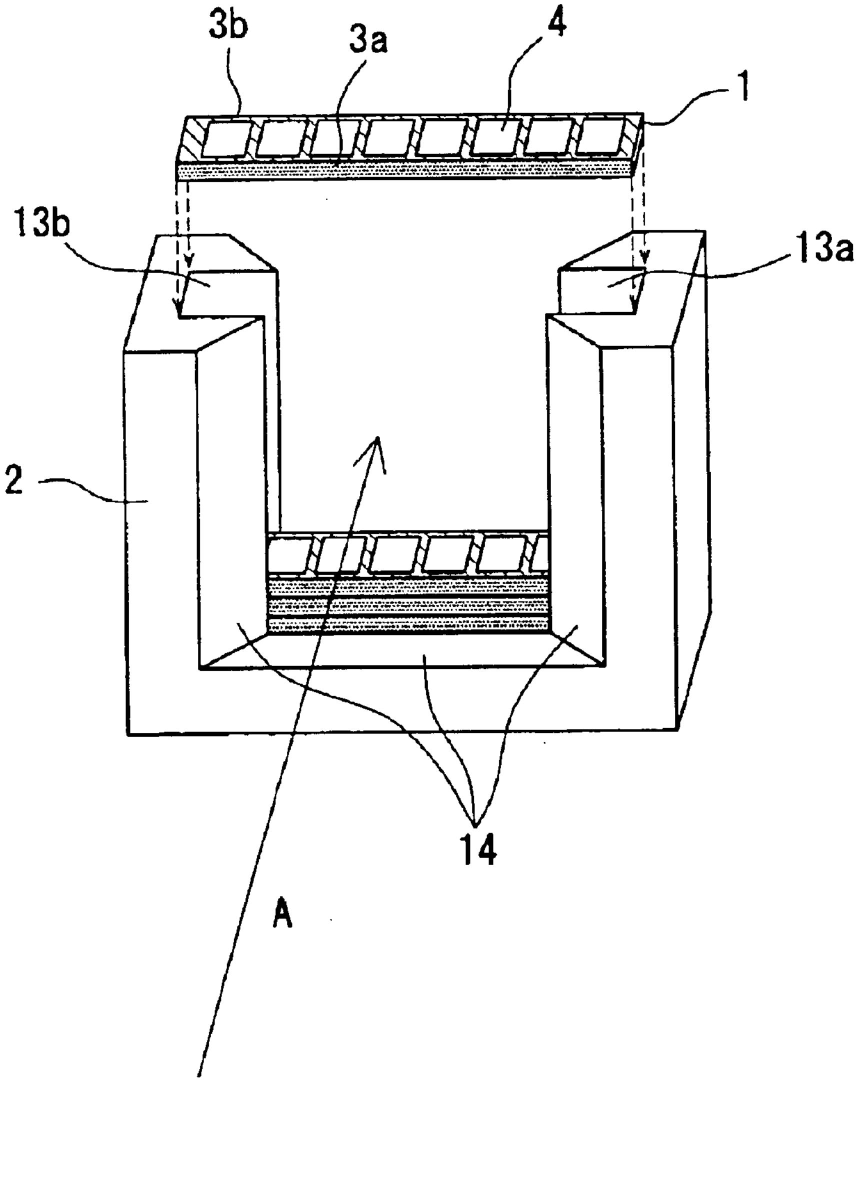
FIG. 3 shows a state that laser bar are housed in a bar arranging jig.

FIG. 3 is an explanatory view showing a method of inserting semiconductor lasers, which is a preparation step for loading the semiconductor lasers onto an electron beam deposition apparatus to coat end faces of the semiconductor lasers.

A semiconductor laser (hereinafter referred to as a laser bar) 1 cut into a strip from a wafer wherein a DH (Double Hetero) structure is formed on a GaAs substrate is inserted into a bar arranging jig 2.

The bar arranging jig 2 is constituted by an almost U-shaped member. Grooves 13*a*, 13*b* are formed at positions opposed to each other in this member. Furthermore, a U-shaped removed portion is formed at least in the front face so that a deposition beam made incident to an end face 3 of the laser bar 1 housed in this bar arranging jig 2 should not be obstructed by the member constituting the bar arranging jig 2.

The grooves 13*a*, 13*b* have a width that is almost equal to the width of the laser bar 1 in a direction perpendicular to the longitudinal direction. The gap between opposite faces of the grooves is almost equal to the length of the laser bar 1 in the longitudinal direction. Therefore, to house the laser bar 1 in the bar arranging jig 2, end portions of the laser bar in the longitudinal direction are inserted while sliding along the respective inner wall faces of the grooves 13*a*, 13*b*. Therefore, the laser bar 1 that is once inserted is fixed by the grooves 13*a*, 13*b* and not removed.

Here, arrow A in the figure shows the incident direction of the end face material from a deposition source in the electron beam deposition apparatus. Therefore, when the laser bar 1 is inserted into the bar arranging jig 2, the laser bar is placed so that an end face 3*a* or 3*b*, which is a cleavage face of the laser bar, should be opposed to the deposition source.

Subsequently, the laser bars 1 are inserted successively in the bar arranging jig 2 with the face having a pattern electrode 4 facing upwards. When the laser bars 1 are housed up to the limit of a predetermined housing capacity of the bar arranging jig 2, laser bars 1 are inserted into a subsequent bar arranging jig 2. At this time, a collection of end faces 3 of the laser bars 1 housed in one bar arranging jig 2 is referred to as a coat batch as one collective unit for convenience.

Figure 4:
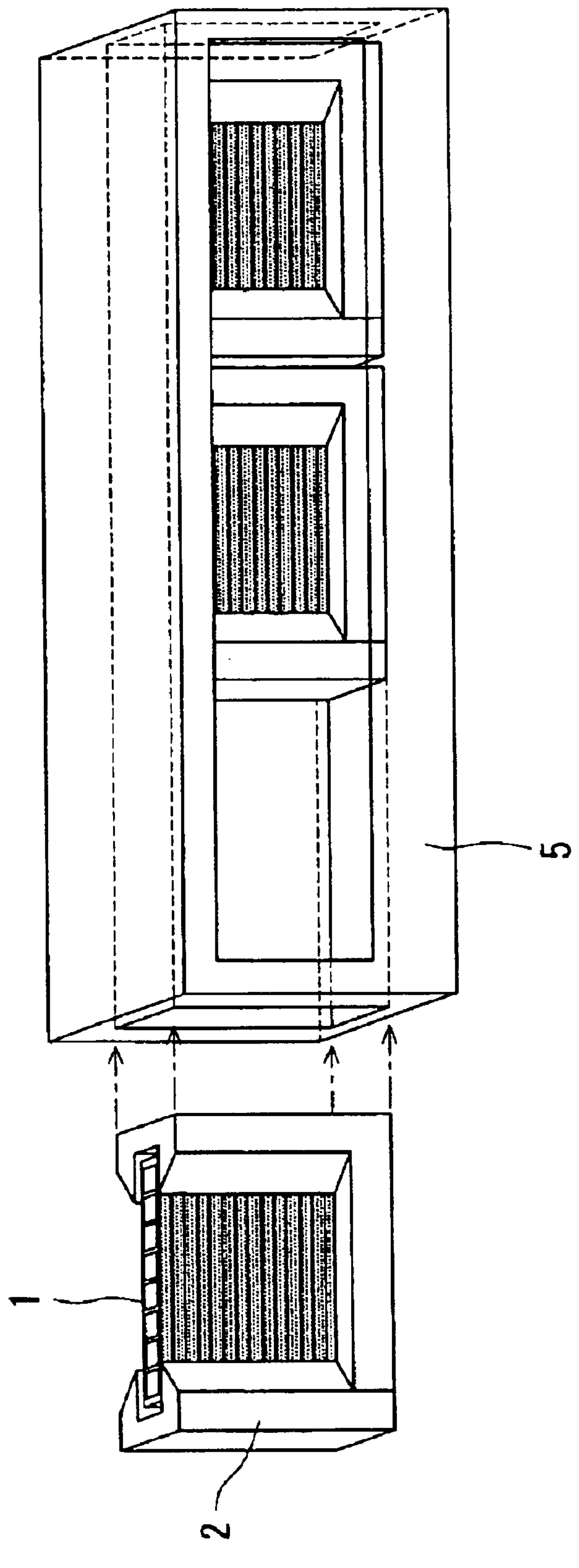
FIG. 4 shows a state that the bar arranging jigs are housed in a fixing frame.

When the laser bars 3 are thus housed in the bar arranging jig 2 and the bar arranging jig 2 is ready, the bar arranging jig 2 is inserted into the fixing frame 5 as shown in FIG. 4. In this embodiment, three bar arranging jigs 2 are housed in a fixing frame 5. Then, three fixing frames 5 are loaded as one unit onto the electron beam deposition apparatus.

Figure 5B:
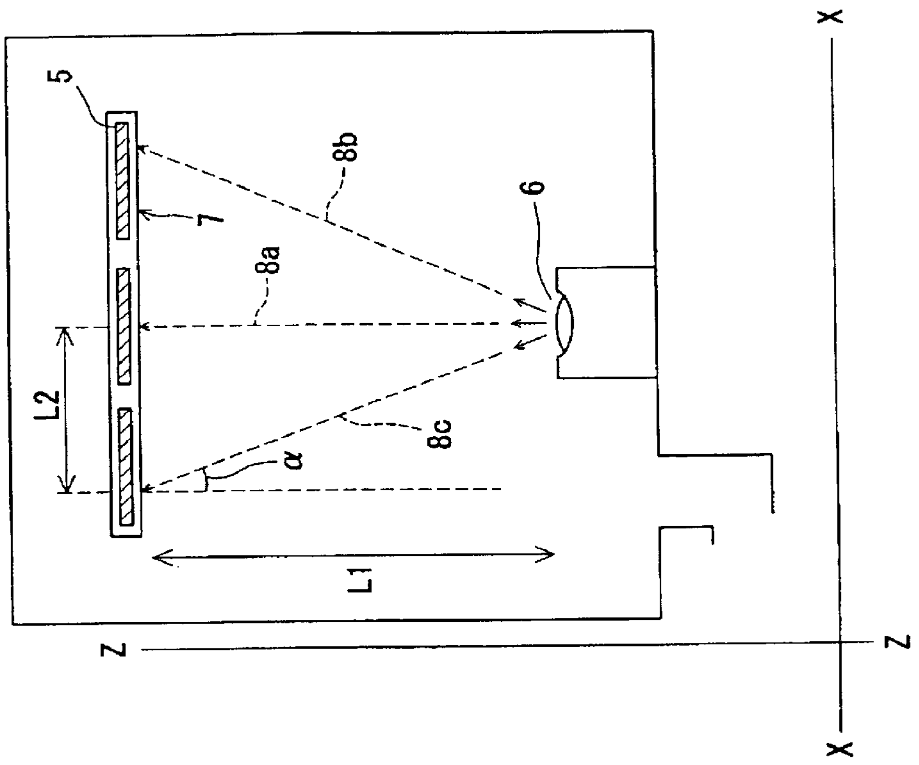
FIGS. 5A and 5B show a state in an electron beam deposition apparatus.
Figure 5A:
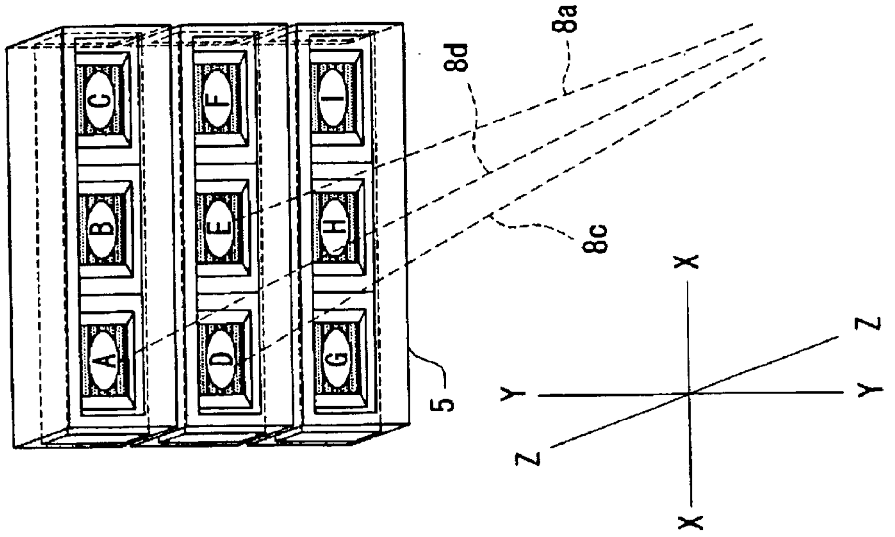

FIGS. 5A and 5B show a state that three fixing frames 5 are stacked and disposed in the electron beam deposition apparatus. As shown in the figures, an X axis extends in the horizontal lateral direction, a Y axis extends in the vertical direction, and a Z axis extends in a direction perpendicular to these axes. These axes are used as required in the following explanations.

Here, alumina is used as a deposition material disposed on the deposition source 6, which is a coating material. The oscillation wavelength is 780 nm. Alumina is heated and evaporated with an electron beam and emitted to each of the coat batches disposed on an array face 7 formed with the fixing frames 5 on an X-Y plane shown in the figures. Alumina emitted from the deposition source 6 towards the respective coat batches at this time is referred to as deposition beams 8.

In this embodiment, the distance L1 from the deposition source 6 to the array face is about 60 cm. The distance L2 on the X axis between the deposition beam 8*a* to a coat batch positioned at a position on the array face 7 opposed to the center of the deposition beam shown in the figure and the position of a coat batch at which the deposition beam 8*d* is made incident so that the incident angle to the array face 7 should be the largest is about 6 cm.

Operations of the present invention are also explained below with reference to the FIGS. 5A and 5B.

When deposition is completed by the above-described deposition beam 8, a deposition film having a predetermined thickness is formed on each coat batch.

However, the thicknesses of the deposited films vary due the difference in the amounts of the deposition beam transported through a unit area per unit time, that is, the difference in flux between the deposition beam 8*a* having an incident angle of 0° to the coat batch shown in the figure and the deposition beam 8*c* or 8*b* having an incident angle of α to the coat batch. When the flux is uniformly distributed, there is usually a difference of about 6° in incident angles between the deposition beam 8*a* and the deposition beam 8*c* under the above condition. Furthermore, at this time, the difference in incident angles between a first incident angle by the deposition beam 8*a* and a second incident angle by the deposition beam 8*d* is about 8°. In practice, the deposition beam has the largest flux along the central axis, and the larger the angle to the central axis is, the smaller the amount of the flux becomes.

Figure 1:
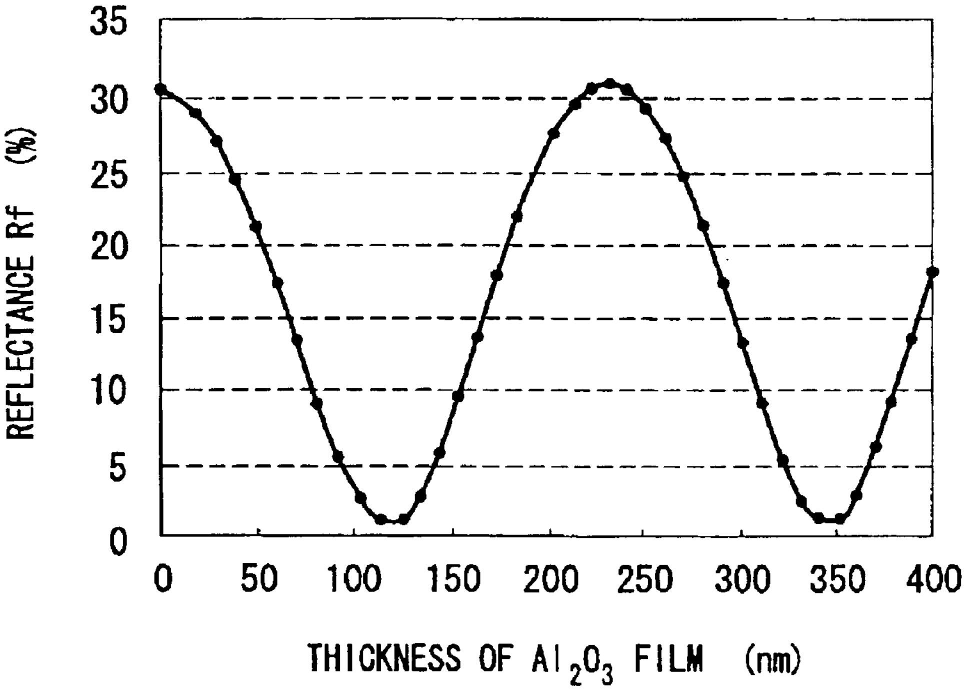
FIG. 1 shows the relationship between the film thickness of an end face coat and its reflectance.
Figure 2:
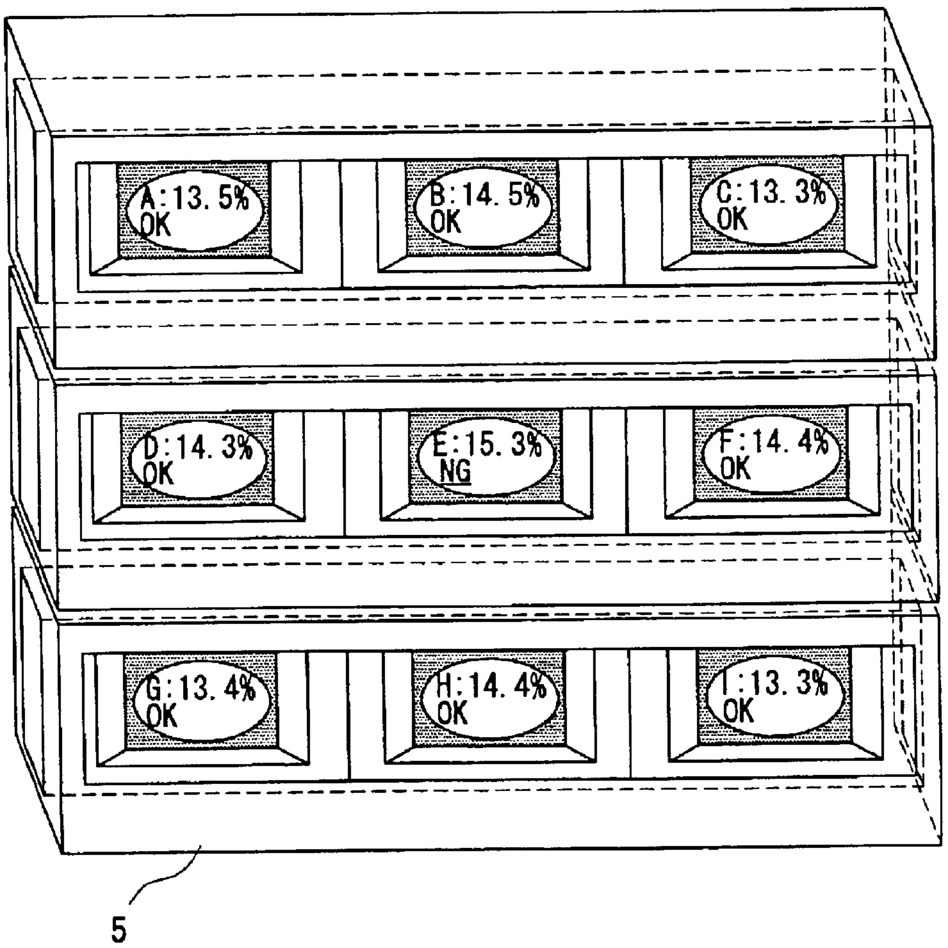
FIG. 2 shows reflectances of coat batches after completion of deposition.

In this embodiment, the target value of the thickness of a film formed on each coat batch is set to be 159±5 nm so that the reflectance of the end face (cleavage face) after completion of deposition should be 13±2%. However, in practice, there are coat batches that exceed the predetermined reflectance after completion of deposition as shown in FIG. 2 due to the aforementioned difference in incident angles.

Usually, the reflectance is higher around the central portion due to the difference of flux, and the coat batch at position A in the figure (also those at positions C, G and I) and the coat batch at position E have a 1 to 2% difference in reflectances after completion of deposition. Furthermore, since the reflectances vary even in the same coat batch due to variations in machining accuracy or the like of each laser bar 1, about ±1.5% reflectance variations in each end face 3 may occur even when a bar arranging jig 2 is disposed at the same position.

The present invention prevents product defects due to such film thickness variations by adjusting the incident angle of the deposition beam. Furthermore, the object is to set the difference between incident angles of the incident beam to coat batches to be within maximum 5% so that the film thickness should be within a range of 159±5 nm. However, the values are not limited to these, but depend on the deposition material or use purpose of the semiconductor laser.

Figure 6:
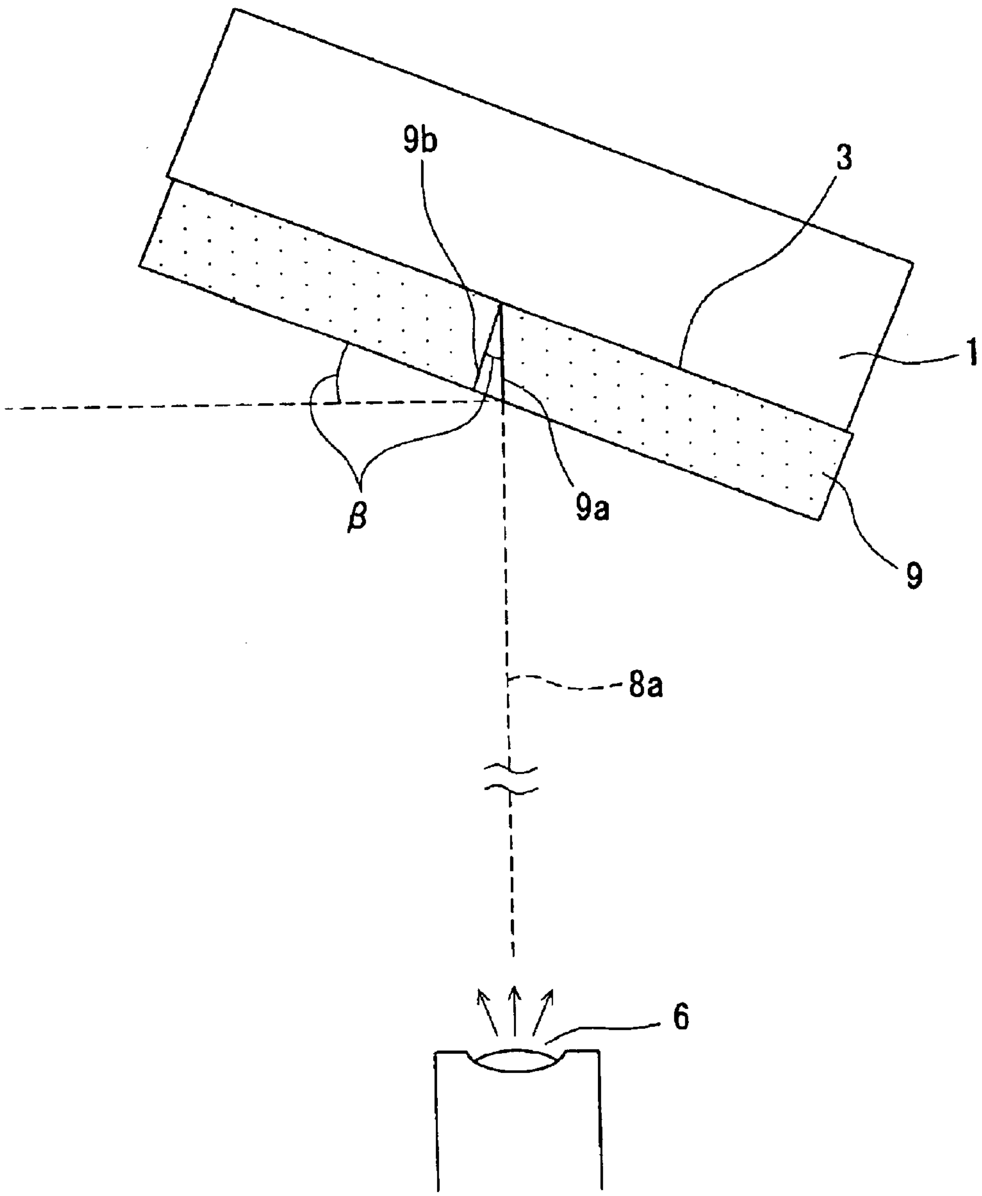
FIG. 6 shows a change in the film thickness by angle adjustment according to the present invention.

In the present invention, an area of an end face 3 on which a coating material in the same flux is deposited is increased so that the deposition amount per unit area should be reduced, thereby reducing the film thickness. This is explained in detail below with reference to FIG. 6.

This figure shows a state of a deposition film 9 formed on an end face 3 of a laser bar 1 by deposition. In this case, when the width of the same laser bar 1 from an end to the other end is very fine as compared with the distance from the deposition source, the film thickness of the deposition film 9 formed on the end face 3 becomes uniform in a direction parallel to a deposition beam 8*a*. When the film thickness at this time in a direction of the central axis of the deposition beam 8*a* is 9*a* and the film thickness perpendicular to the end face 3 is 9*b*, the film thickness that determines a performance of this semiconductor laser in practice is 9*b*. As shown in the figure, 9*b* is expressed as Actual film thickness 9*b*=film thickness 9*a* in direction of deposition beam central axis×cos β.

Furthermore, at this time, since $0 \leqq \cos\beta \leqq 1$, 9*b* is reduced as compared with the film thickness 9*a* in the direction of the central axis of the deposition beam at an incident angle 0° by inclining the end face 3 by β°. That is, When α is 6° on the assumption that the flux is uniformly distributed, β can be 6 to 8°. In this case, as a result, the reflectance of a coat batch E shown in FIG. 2 can be matched to a predetermined reflectance range of 15.3 (before angle adjustment) to 14.9%. Since the flux is distributed in practice, more appropriate reflectance can be obtained when the angles are adjusted to obtain α<β, considering that coat batches in the central portion have stronger flux than that of coat batches on the outer side. Specifically, by setting β to be 9° when α is 6°, the reflectance of the coat batch E can be reduced from 15.3% (before angle adjustment) to 14.4%, which is the optimal value with almost no difference from those of other coat batches.

Therefore, when the angle of the laser bar arranging jig 2 in the fixing frame can be adjusted freely, the film thickness of the coat batch formed in laser bars 1 housed in the laser bar arranging jig 2 can be adjusted.

Here, an adjustment mechanism for adjusting the angle of the laser bar arranging jig 2 provided in the aforementioned fixing frame 5 is explained with reference to FIG. 7. FIG. 7A is a perspective view of a fixing frame 5. FIG. 7B is a cross sectional view of a side face of the fixing frame 5. Since the cross section of the bar arranging jig 2 housed in the fixing frame 5 is smaller than the cross section of the fixing frame 5 as shown in FIG. 7B, the angle of the bar arranging jig 2 can be adjusted in the fixing frame 5, which is explained later.

Figures 7A, 7B:
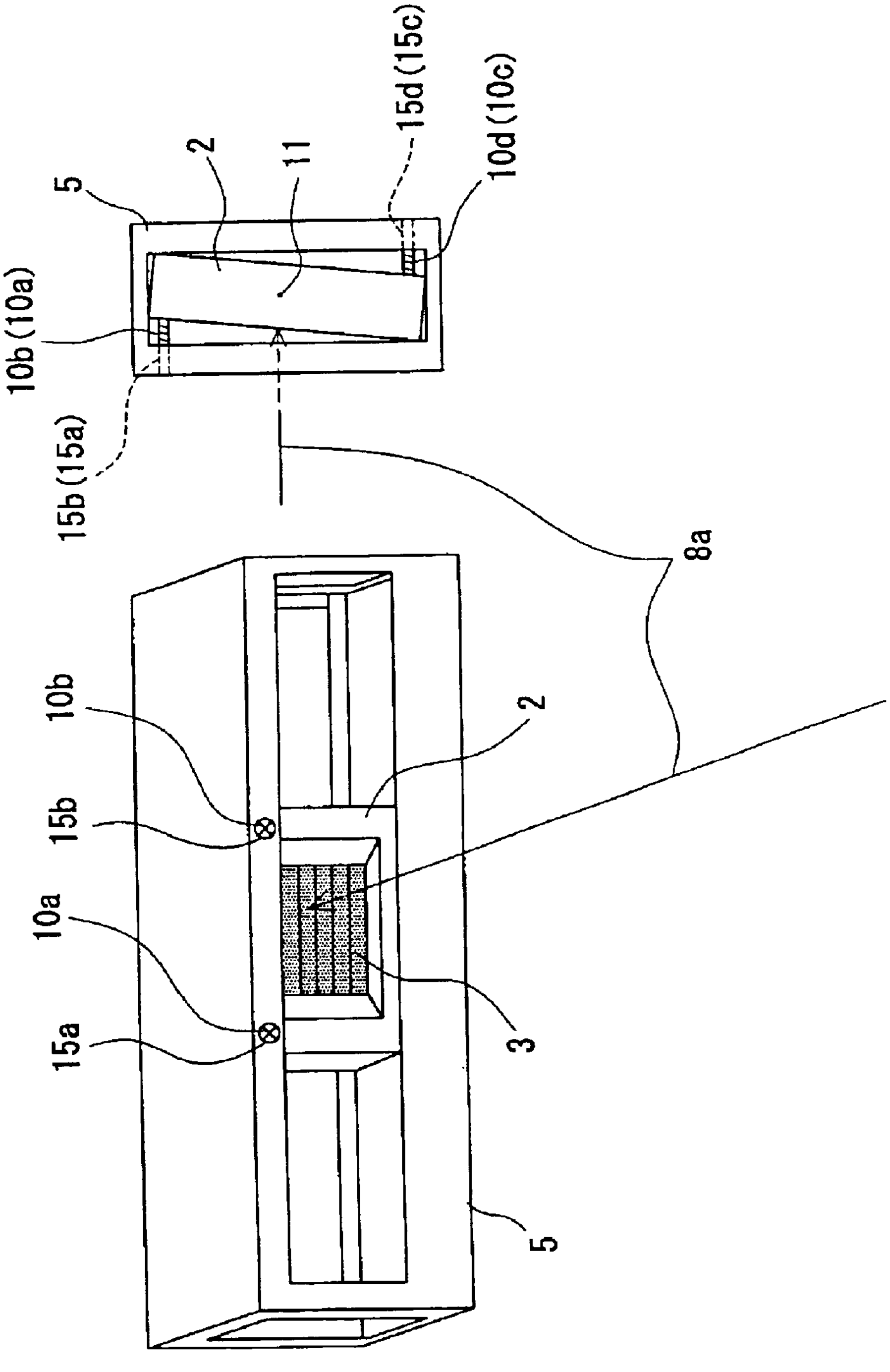
FIGS. 7A and 7B show an angle adjustment mechanism of the fixing frame according to one embodiment of the invention.

As shown in FIG. 7B, the fixing frame 5 is provided with screw holes 15*a*–15*d* for screw-threading contact screws 10 (10*a*–10*d*) at substantially diagonal positions to adjust the amount of its contact with the laser bar arranging jig 2. The amount of contact of each screw 10 with the bar arranging jig 2 can be adjusted by adjusting the amount of screw-threading into the fixing frame 5. The pressing force for pressing the upper and lower portions of the laser bar arranging jig 2 in directions opposite to each other can be adjusted by this adjustment of the contact amount. Furthermore, since, among these contact screws 10 (10*a*–10*d*), the contact screws 10*a* and 10*b* press the upper portion of the bar arranging jig 2 from the front towards the rear and the contact screws 10*c* and 10*d* press the lower portion of the bar arranging jig 2 in the opposite direction, the bar arranging jig 2 rotates about the rotation center point 11 by an action of these pressing forces.

Consequently, the rotation angle when the laser bar arranging jig 2 rotates about the rotation center point 11 by the pressing force of each contact screw 10 (10*a*–10*d*) can be adjusted and thus the angle of a coat batch constituted by this laser bar arranging jig 2 with the array face 7 in the fixing frame can be changed.

At this time, the fixing frame 5 is disposed on a array face assuming the central axis of the deposition source, that is, the deposition beam 8*a* from the deposition source 6 in FIG. 5 towards the fixing frame 5 as a normal line while the X coordinate and the Y coordinate both remain the same. Therefore, by adjusting the angle of the laser bar arranging jig 2 in the fixing frame 5, the incident angle of the deposition beam to the coat batch constituted by this laser bar arranging jig 2 can be adjusted, thereby adjusting the film thickness.

Figure 8:
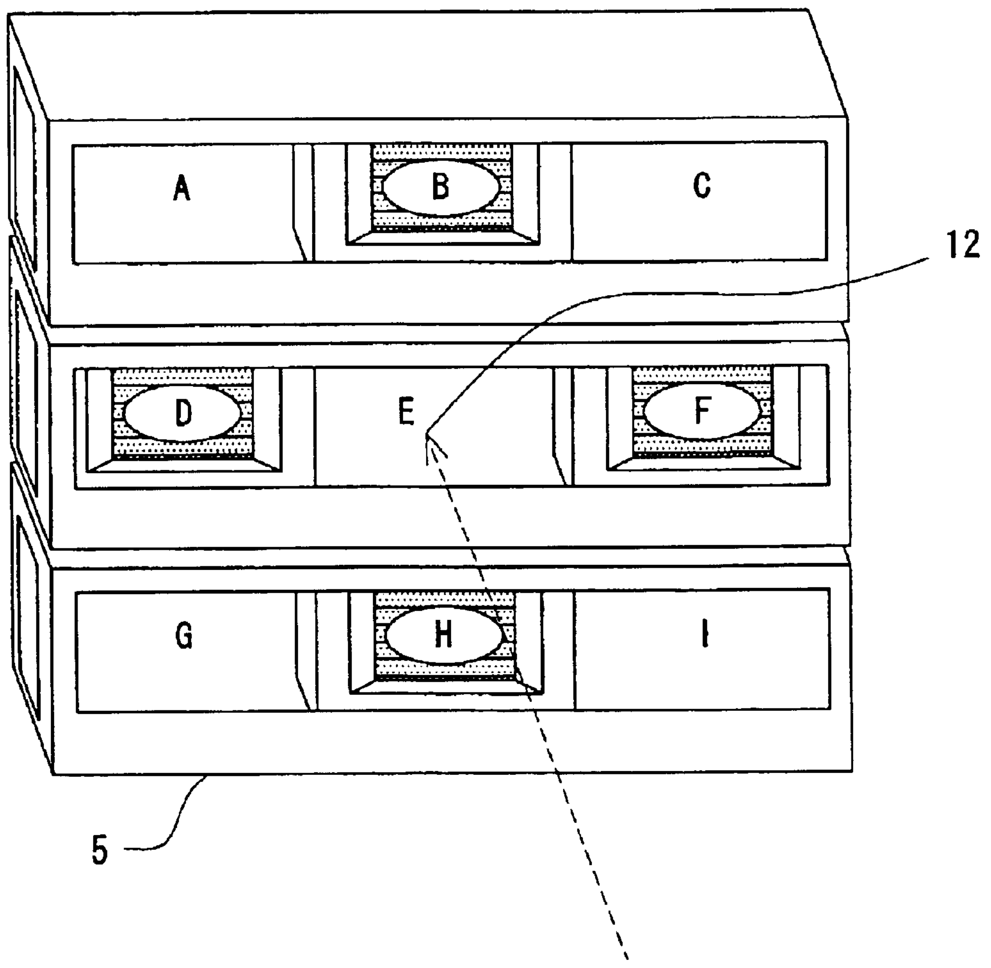
FIG. 8 shows a second embodiment of the invention.

A second embodiment of the invention is explained below with reference to FIG. 8. As in the case of the embodiment shown in FIGS. 5A and 5B, FIG. 8 shows a state that 3 vertical columns×3 horizontal rows of laser bar arranging jigs 2 are arranged and loaded onto an electronic beam deposition apparatus.

As described above, the thickness of a film to be formed is determined by flux depending on the incident angle of the deposition beam 8. The incident angle is increased in proportion to the distance from a position 12 opposed to the central axis of the deposition beam. That is, the thicknesses of films formed on coat batches positioned in the same distances from the opposed position 12 become equal. In this embodiment, to utilize this technique, the laser bar arranging jigs 2 are arranged only at positions B, D, F and H shown in the figure.

Although this is not shown in the figure, the same effect can be obtained when the laser bar arranging jigs 2 are arranged only at positions A, C, G and I.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for coating a semiconductor laser end face with a coating material by electron beam deposition by disposing a plurality of coat batches each constituted by semiconductor laser end faces on an array face having a central axis of a deposition beam as a normal line, comprising:

adjusting at least a first incident angle so that the angle difference between the first and a second incident angle is within a predetermined range, wherein said first incident angle is an incident angle of a deposition beam to a coat batch located at a intersection point of the central axis of the deposition beam with the array face and said second incident angle is an incident angle of a deposition beam to the coat batch located at a farthest position from the intersection point on the array face.

* * * * *